(12) United States Patent
Konishi et al.

(10) Patent No.: US 7,354,482 B2
(45) Date of Patent: Apr. 8, 2008

(54) FILM DEPOSITION DEVICE

(75) Inventors: Yoshiyuki Konishi, Hadano (JP); Katsutoyo Osanai, Kanagawa-ken (JP)

(73) Assignee: Shimadzu Corporation, Kyoto (JP)

( * ) Notice: Subject to any disclaimer, the term of this patent is extended or adjusted under 35 U.S.C. 154(b) by 374 days.

(21) Appl. No.: 10/954,145

(22) Filed: Sep. 30, 2004

(65) Prior Publication Data

US 2005/0081790 A1   Apr. 21, 2005

(30) Foreign Application Priority Data

Oct. 15, 2003  (JP) ............................ 2003-355101
Mar. 22, 2004  (JP) ............................ 2004-083046

(51) Int. Cl.
*H01L 21/00* (2006.01)
*C23C 16/00* (2006.01)
*C23C 14/00* (2006.01)

(52) U.S. Cl. ............. 118/712; 118/723 R; 156/345.28; 204/298.01

(58) Field of Classification Search ........... 156/345.28; 118/712, 723 R; 204/298.01
See application file for complete search history.

(56) References Cited

U.S. PATENT DOCUMENTS

| | | | |
|---|---|---|---|
| 3,757,119 A * | 9/1973 | McCaughan et al. | 250/304 |
| 5,858,477 A * | 1/1999 | Veerasamy et al. | 427/562 |
| 6,847,036 B1 * | 1/2005 | Darling et al. | 250/291 |
| 2002/0030167 A1 * | 3/2002 | Liebert et al. | 250/492.21 |
| 2002/0068132 A1 * | 6/2002 | Skinner et al. | 427/524 |
| 2002/0070347 A1 * | 6/2002 | Bisson et al. | 250/423 R |

FOREIGN PATENT DOCUMENTS

JP  57087829 A  *  6/1982
JP  6-331810       12/1994

* cited by examiner

*Primary Examiner*—Ram N. Kackar
(74) *Attorney, Agent, or Firm*—Manabu Kanesaka

(57) ABSTRACT

A film deposition device for depositing a film includes a depositing chamber for depositing the film with plasma. A plasma quantity monitoring device is disposed in the depositing chamber for monitoring a plasma quantity entering the depositing chamber at real time. A calculating device is electrically connected to the plasma quantity monitoring device for calculating a thickness of the film from the plasma quantity so that the thickness is monitored at real time.

13 Claims, 8 Drawing Sheets

FILM DEPOSITION DEVICE

BACKGROUND OF THE INVENTION AND RELATED ART STATEMENT

The invention relates to a film deposition device for depositing a protective film or a functional film on a surface of a film material such as a film and sheet, or a solid material such as a magnetic head.

Heretofore, in order to control a thickness of a film deposited by a film deposition device and stop the device at appropriate time, a time control or in-situ film thickness monitoring control has been carried out. In the time control, it is assumed that a film thickness is proportional to film deposition time. The film thickness and the film deposition time are measured beforehand, and a film deposition speed per unit time is calculated. The film deposition is stopped manually or automatically at time when a desired thickness is obtained based on the data obtained described above. In the in-situ film thickness monitoring control, a thickness is measured at real time by using a quartz oscillator type film thickness monitor, an Ellipsometer type film thickness monitor and the like. The film deposition is stopped manually or automatically at time when a desired thickness is obtained.

Hereunder, a structure and an operation of a conventional in-situ film thickness monitoring control will be explained with reference to FIG. 7. Reference numeral 1 represents a plasma source, wherein a filtered catholic vacuum arc (hereinafter referred to as FCVA) using arc discharge has been practically used (refer to Shimadzu Corporation catalog C676-0091, 'Filtered Catholic Vacuum Arc (FCVA)'). A plasma CVD using high frequency discharge in a magnetic field has also been used practically.

In the plasma source 1, a plasma flow 3, i.e. a mixture of electrons having negative charges and positive ions of a material of a film, is generated. A guiding path 2 is provided for guiding the plasma flow 3 into a depositing chamber 6. Generally, the guiding path 2 is formed of a mechanical electromagnetic filter for removing neutral particles other than plasma (refer to Shimadzu Corporation catalog C676-0091, 'Filtered Catholic Vacuum Arc (FCVA)'). In the depositing chamber 6, there are disposed a shutter 5 fixed to a shutter shaft 4, a monitoring sensor 7, a substrate holder 9 and a substrate 10 detachably attached to a substrate holder 9. The shutter shaft 4 is rotated by a motor M to open and close the shutter 5. FIG. 7 shows a state where the shutter 5 is opened. The positive ions in the plasma are accumulated on the substrate 10 to deposit a film. A part of the positive ions is accumulated on the monitoring sensor 7. The monitoring sensor 7 is a quartz oscillator type film thickness monitoring sensor. An accumulated weight of the material on the monitoring sensor 7 changes an oscillation frequency of the quartz oscillator, and an electric signal is sent to a control power source 11 through a transmission line 8. The control power source 11 displays the change in the oscillation frequency of the quartz oscillator, and a film deposition completion signal is sent when the oscillation frequency reaches a predetermined value.

Under an assumption that the accumulated weight of the material on the monitoring sensor 7 is proportional to a thickness of the film deposited on the substrate 10, a relationship between the thickness and the change in the oscillation frequency is obtained beforehand as calibration data. Accordingly, it is possible to send the completion signal from the control source 11 at proper time. A thickness of the film deposited on the substrate 10 is separately measured by a commercially available mechanical film thickness meter or an Ellipsometer (described later) to obtain the calibration data as described above.

Incidentally, as another method for measuring a film thickness, an in-situ spectro-Ellipsometer may be used (refer to J. A. Woollam, Japan-Research and Instrumentation —Technical Report— 'Analysis Method of Ellipsometer Data'). In this case, an optical beam is incident on the substrate 10 during the film deposition through an optical window (not shown) from outside of the depositing chamber 6. Light reflected from a film deposition surface is guided outside of the depositing chamber 6 and incident on a sensor (not shown) of Ellipsometer, so that a polarized state of the reflected light is analyzed to calculate a film thickness. There has been also developed another type of Ellipsometer, wherein a combination of an optical beam illuminator and a sensor using a vacuum-resist type optical fiber is introduced in the depositing chamber 6, and light is incident on the substrate 10 without using the vacuum window to measure a film thickness. In the present specification, such a quartz oscillator type film thickness monitoring sensor is explained.

Before a film is deposited, the calibration data is obtained in a preparation process. In the film deposition process, first, the plasma source 1, the guiding path 2 and the depositing chamber 6 are evacuated by a vacuum pump (not shown) to a predetermined vacuum rate. A predetermined gas or particles (not shown) as a raw material of the film are supplied to the plasma source 1 to continue the discharge, and the plasma starts generating in a state that the shutter 5 is closed. Next, the shutter 5 is opened to flow the plasma flow 3 against the substrate 10 so that the positive ions of the material are accumulated on the substrate 10. When a predetermined film thickness according to the calibration data is obtained, the deposition completion signal is sent from the control power source 11 to the motor M to rotate the shutter shaft 4, so that the shutter 5 is closed to thereby complete the film deposition.

Incidentally, a property of the film deposited on the substrate 10 is influenced by a potential of the substrate 10. Accordingly, a potential from an outer power source (not shown) is supplied to the substrate 10 as needed. For example, when the substrate 10 is held at a negative potential, it is possible to control a quantity of the electrons entering the substrate 10 together with the positive ions of the material.

As shown in FIG. 8, a further conventional film deposition device has been proposed, wherein the plasma flow 3 is deposited in a beam shape through the guiding path 2 with a specific shape or an electromagnetic device (not shown). A scanner SU is provided in the vicinity of an incident position of the plasma flow 3 entering the depositing chamber 6, so that the plasma flow 3 is scanned in a vertical direction and in a direction perpendicular to a surface of the drawing. Hereinafter, such a device is referred to as a scanning type film deposition device. In this case, the plasma beam at certain time is oriented in only one direction, such as a direction of the monitoring sensor 7 or a direction of the substrate 10, so that a specific point is irradiated every cycle determined by a setting condition of the scanner SU.

Therefore, the oscillation frequency of the monitoring sensor 7 is changed in a step pattern at every cycle, and the electrical signal is sent to the control power source 11 through the transmission line 8. In FIG. 8, the structural elements and operation except the guiding path 2 and the scanner SU are basically the same as those shown in FIG. 7, so that explanations thereof are omitted. Also, in FIG. 8, the shutter shaft 4, the shutter 5 and the motor M shown in FIG. 7 are omitted.

The conventional film deposition devices have the structures described above. In the structures, a control area and control accuracy of the film thickness are not sufficient. In other words, a quantity of the plasma generated by the plasma source is fluctuated with time due to variations in gas flow quantity, discharge intensity and the like. However, in the time control, there is no function to follow the fluctuation, i.e. a change in the film deposition rate, in real time, thereby making it difficult to constantly control the film thickness. In the quartz oscillator type film thickness monitor, the weight change of the material is monitored as the frequency change. The frequency change is generally not large enough for measuring a thin film having a thickness less than 100 nm. Accordingly, when a protective film having a thickness of, for example, 2 to 3 nm, is formed on a magnetic head, it is difficult to use the method.

The Ellipsometer is suitable for measuring a film thickness in the atmosphere without any time restriction and has a high accuracy. However, it is necessary to take time for analysis to measure the polarization quantity and calculate a thickness. Even if the in-situ spectro-Ellipsometer type film thickness monitor is used, the analysis requires time in the order of a few seconds and the measurement becomes discrete. Accordingly, it is difficult to measure a film thickness increasing at a high speed at real time and immediately close the shutter 5. Further, it is necessary to perform smoothing calculations based on the data several times and output the film deposition completion signal based on estimated completion time. In particular, when a film has a thickness less than several tens of nm, the film deposition time becomes shorter than the analysis time, so that it is very difficult to accurately control a film thickness. Therefore, in order to apply the method with high precision, it is necessary to reduce the film deposition rate to an extremely small rate, or interrupt the film deposition several times to measure a film thickness repeatedly, thereby making the process complicated and lowering throughput.

In the conventional structure, the monitoring sensor 7 monitors the accumulated quantity of the material. Accordingly, when an intensity of the plasma flow 3 is significantly fluctuated with time or the plasma flow 3 has a fluctuated distribution with time, the correlation between the accumulated quantity to be monitored and a thickness of a film deposited on the substrate 10 is not always sufficient. That is, in the film deposition device shown in FIG. 8, when the flow rate of the plasma is fluctuated with time, since the plasma flow beam does not irradiate the monitoring sensor 7 at the same time when the plasma flow beam irradiates the substrate 10, an output of the monitoring sensor 7 does not correctly reflect the plasma quantity on the substrate 10, thereby shifting the correlation.

Also, the plasma flow beam irradiates the monitoring sensor 7 in an extremely short period of time as compared with the film deposition time. Accordingly, the accumulated quantity of the material irradiating the monitoring sensor at certain time is small and influenced by a noise. Further, in the system shown in FIG. 7, when a distribution of the plasma flow 3 entering the depositing chamber 6 through the guiding path 2 is fluctuated with time, the correlation between the output of the monitoring sensor 7 and a thickness of a film deposited on the substrate 10 is impaired, thereby making it difficult to accurately control a film thickness.

In view of the problems described above, an object of the present invention is to provide a film deposition device for accurately controlling a film thickness.

Further objects and advantages of the invention will be apparent from the following description of the invention.

SUMMARY OF THE INVENTION

In order to attain the objects described above, according to the present invention, a film deposition device includes a plasma quantity monitoring device disposed in a depositing chamber for monitoring a plasma quantity at real time and a calculating device for calculating a thickness of a film, so that the thickness of the film is obtained at real time.

In the present invention, it is possible to follow a fluctuation in the plasma quantity at a high response speed in a wide range from a thin film to a thick film. Accordingly, it is possible to accurately measure and control a film thickness.

DETAILED DESCRIPTION OF PREFERRED EMBODIMENT

Hereunder, embodiments of the present invention will be explained with reference to the accompanying drawings. A film deposition device has a film deposition chamber, or a depositing chamber, for generating plasma of a material to be deposited to form a film. A plasma quantity monitoring device is disposed in the depositing chamber for monitoring a plasma quantity at real time, and a calculating device is provided for calculating a thickness of a deposit or film, so that the thickness of the deposit or film is monitored at real time. A quantity of electrons constituting the plasma is measured to monitor the plasma quantity. Incidentally, in the following embodiments, the plasma quantity monitoring device is called a Faraday cup.

Figure 1:
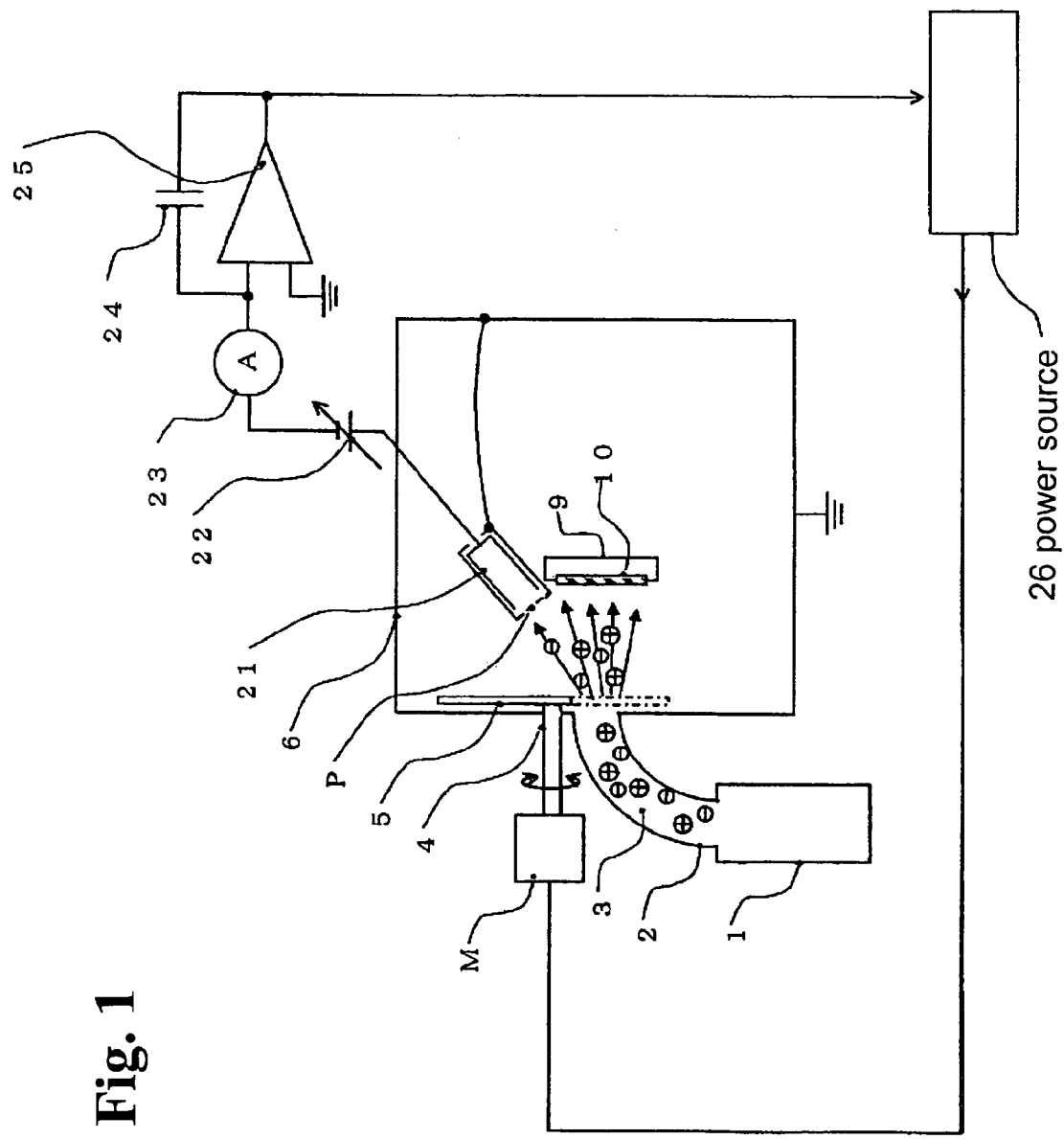
FIG. 1 is a block diagram showing a film deposition device according to an embodiment of the present invention.

FIG. 1 is a block diagram showing a structure according to an embodiment of the present invention. Reference numeral 1 represents a plasma source for generating a plasma flow 3, i.e. a mixture of positive ions of a material to be deposited and electrons. Reference numeral 2 represents a guiding path for guiding the plasma flow 3 into a depositing chamber 6. Reference numeral 9 represents a substrate holder for holding a substrate 10. The substrate holder 9 has an opening in a direction facing the plasma flow 3 and is disposed close to a Faraday cup 21 formed of double circular cylinders insulated each other. A bias power source 22 is connected to an inner circular cylinder of the Faraday cup 21 for providing a positive voltage, and is also connected to an ammeter 23 for measuring a current flowing in the Faraday cup 21.

The ammeter 23 collaborates with an amplifier 25 connected to a capacitor 24 for integrating a quantity of electrical charges passing through the ammeter 23. An integrated value of the electrical charges is converted to a thickness of a deposit at real time, and displayed as a deposit thickness output signal. When the deposit reaches a predetermined thickness, a control power source 26 generates a deposition completion signal. Upon the deposition completion signal, a motor M is actuated to rotate a shutter shaft 4 to close a shutter 5. Incidentally, the Faraday cup 21 is disposed close to the substrate holder 9 at a position where they are not blocked each other, and the outer circular cylinder thereof is normally connected to ground. A wire netting P is provided at an entrance portion of the outer circular cylinder. The wire netting P is also called as a grid, and shields an electric field inside the Faraday cup 21 not to move out to outside.

The positive ions of the substance to be deposited in the plasma flow 3 are accumulated on the substrate 10 on the substrate holder 9 to deposit a film. At the same time, a part of the plasma flow 3 enters the Faraday cup 21, and electric charges entering the inner circular cylinder are taken out as current. In the present embodiment, the electron current in the plasma flow 3 is measured as a quantity having a direct correlation with the plasma flow quantity. A positive potential is provided to the inner circular cylinder from the bias power source 22. Accordingly, the positive ions in the plasma flow 3 are repelled and do not enter the inner circular cylinder, so that only the electron current flows in the amplifier 25 through the ammeter 23 and is detected as a Faraday cup current.

Figure 2:
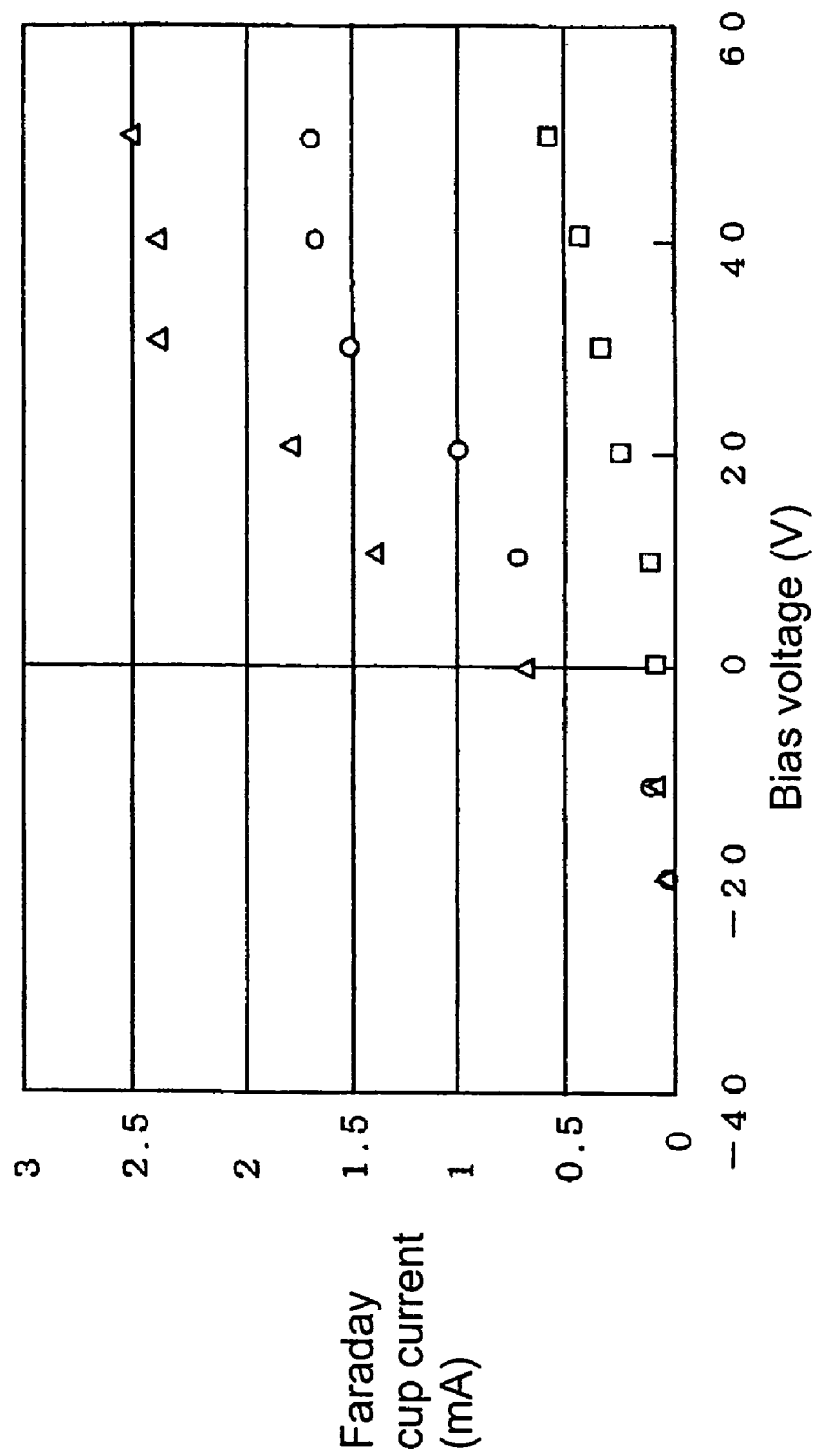
FIG. 2 is a chart showing a relationship between a current of a Faraday cup and a bias voltage.

FIG. 2 shows a relationship between a current of the Faraday cup (unit mA) and a bias voltage (unit V) supplied from the bias power source 22 with respect to the plasma flow 3 having three levels of intensities (corresponding to symbols □, O, Δ in FIG. 2). As shown in FIG. 2, when a voltage larger than 40 V is applied, the current of the Faraday cup tends to be saturated. The result indicates that the positive ions are prevented from entering and only the electron current is detected. Incidentally, when neutral particles and the like collide with the inner circular cylinder of the Faraday cup 21 to discharge secondary electrons to outside, a current similar to that of the positive ions is generated, thereby creating an error in the plasma quantity. However, since the secondary electrons return to the inner circular cylinder due to the bias voltage described above, the error is prevented to thereby carry out an accurate measurement.

Figure 3:
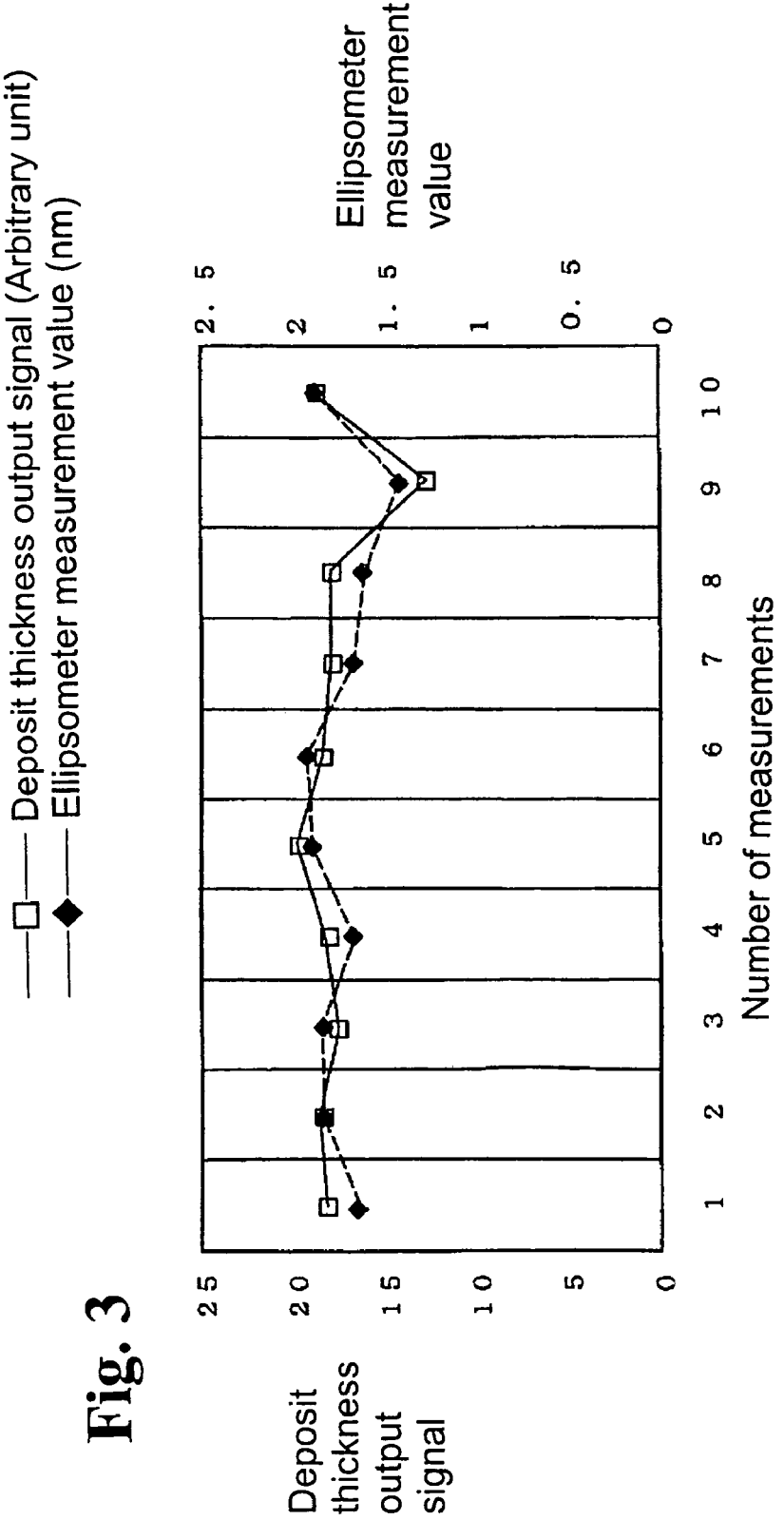
FIG. 3 is a chart showing a film thickness output signal and a measured value of an Ellipsometer.

When the deposit is formed, first, as a preparation process, a relationship between a calculated value of the Faraday cup current and a real deposit thickness is obtained as the calibration data, and the deposition process is carried out. As shown in FIG. 3, there is a sufficient correlation between the calculated value of the Faraday cup current and the real thickness of the deposit. In the deposition process, as shown in FIG. 1, the plasma source 1, the guiding path 2 and the depositing chamber 6 are evacuated by a vacuum pump (not shown) to a predetermined vacuum rate. A gas or particles (not shown) of the material to be deposited are supplied to the plasma source 1 for continuously allowing the plasma source 1 to discharge, and the plasma starts generating while the shutter 5 is closed.

Next, the shutter 5 is opened to allow the plasma flow 3 to enter the substrate 10, so that the positive ions of the material to be deposited accumulate on the substrate 10.

When a predetermined thickness according to the calibration data is obtained, the deposition completion signal is generated from the control power source 26, and the motor M, i.e. the shutter shaft 4, is rotated to shift the shutter 5 to a closed state to thereby complete the deposition.

FIG. 3 is a chart showing a relationship between the deposit thickness output signals (i.e. calculated values of the Faraday cup current, arbitrary unit) and values measured by the Ellipsometer (i.e. measured deposit thicknesses, unit nm), in a case that a TaC thin deposit with a thickness of 2 nm is formed 10 times as a sample. It is confirmed that there is a sufficient correlation between the deposit thickness output signals and the measured deposit thicknesses. The deposit thickness output signal is always monitored, and when the signal reaches a value corresponding to a predetermined deposit thickness, the deposition completion signal is outputted to close the shutter 5, so that the deposit thickness can be controlled with high precision. This result indicates that the positive ions and electrons are present in an equal amount. Accordingly, it is a proper method for determining the calculated value of the plasma quantity in which the electron quantity is measured at real time and integrated.

Figure 4:
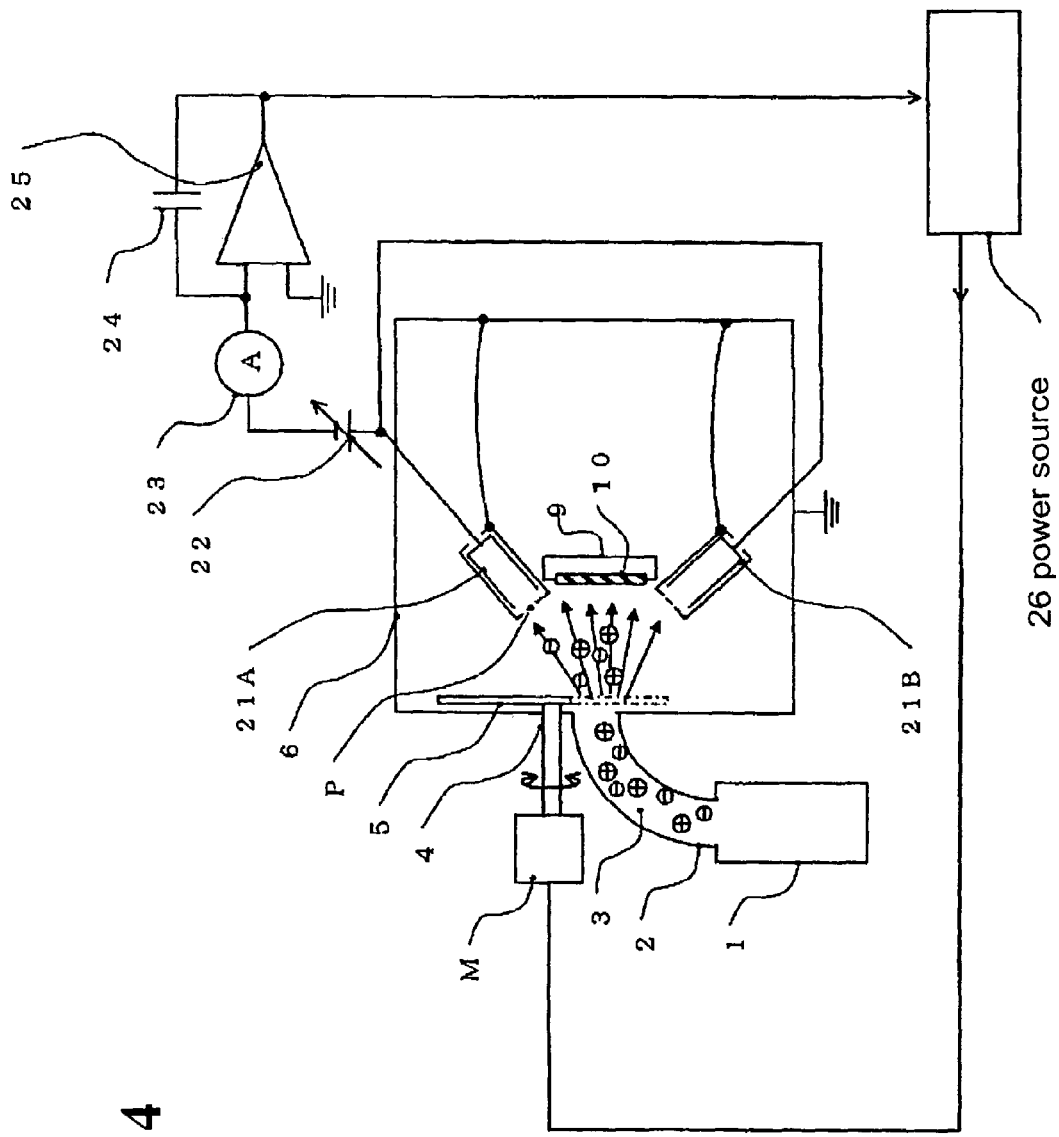
FIG. 4 is a block diagram showing a film deposition device according to another embodiment of the present invention.

FIG. 4 shows a film deposition device according to another embodiment of the present invention. A monitoring device is formed of two Faraday cups 21A and 21B electrically connected to each other. With this structure, the scanning type film deposition device monitors two times per unit time more often than the device with one monitoring device. Accordingly, it is possible to improve the correlation between the output of the monitoring device and the thickness of the deposit deposited on the substrate 10 when the plasma quantity is fluctuated. Also, the output per unit time becomes two times larger, thereby reducing an influence of noise.

The present invention is not limited to the embodiments described above, and various modifications are possible. For example, in the embodiment shown in FIG. 1, the deposition is automatically completed. The deposition may be completed manually by using display of the deposit thickness output signal. A plurality of Faraday cups may be provided in a depositing chamber. In this case, a relative sensitivity of the respective Faraday cups is measured beforehand. A protective cover is provided for preventing the plasma flow from entering other Faraday cups when a first Faraday cup is used. When the first Faraday cup needs to be replaced due to an excess deposit on the first Faraday cup and the like, the other Faraday cup is immediately connected, so that the deposition can be continuously carried out.

Figure 5A:
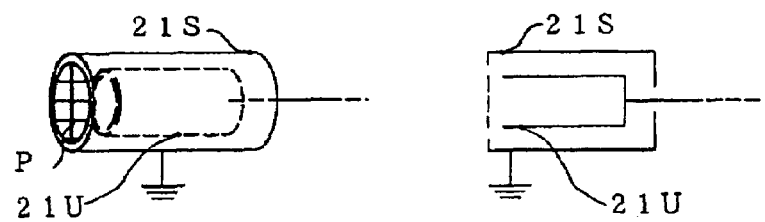
FIGS. 5(a) to 5(d) are views showing modified examples of a Faraday cup according to the invention.
Figure 5B:
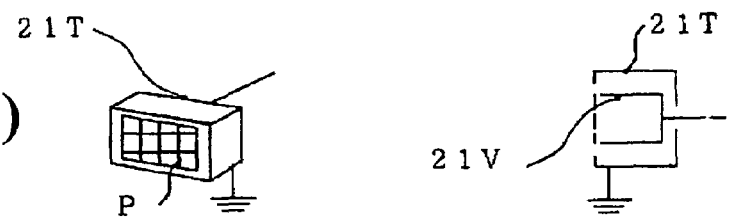

As shown in FIG. 4, two Faraday cups 21A and 21B are electrically connected to each other and used at the same time. A plurality of Faraday cups may be electrically connected to each other, and they are used at the same time. As shown in FIGS. 5(a) to 5(d), the Faraday cup may have various shapes. The Faraday cup shown in FIG. 5(a) is shown in FIGS. 1 and 4, and is formed of an inner circular cylinder 21U, an outer circular cylinder 21S and a wire netting P. As shown in FIG. 5(b), the inner circular cylinder 21U may be replaced with a square inner electrode box 21V. Further, the outer circular cylinder 21S may be replaced with a square outer basket member 21T, so that the plasma entering surface has a rectangular shape and the overall depth is shortened.

Figure 5C:
Figure 5D:
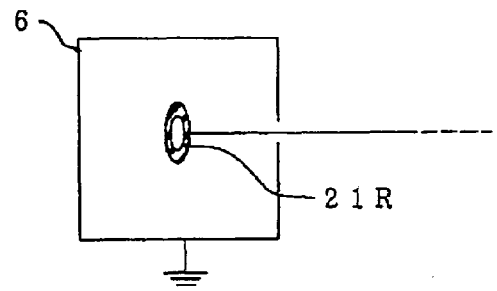
Figure 6:
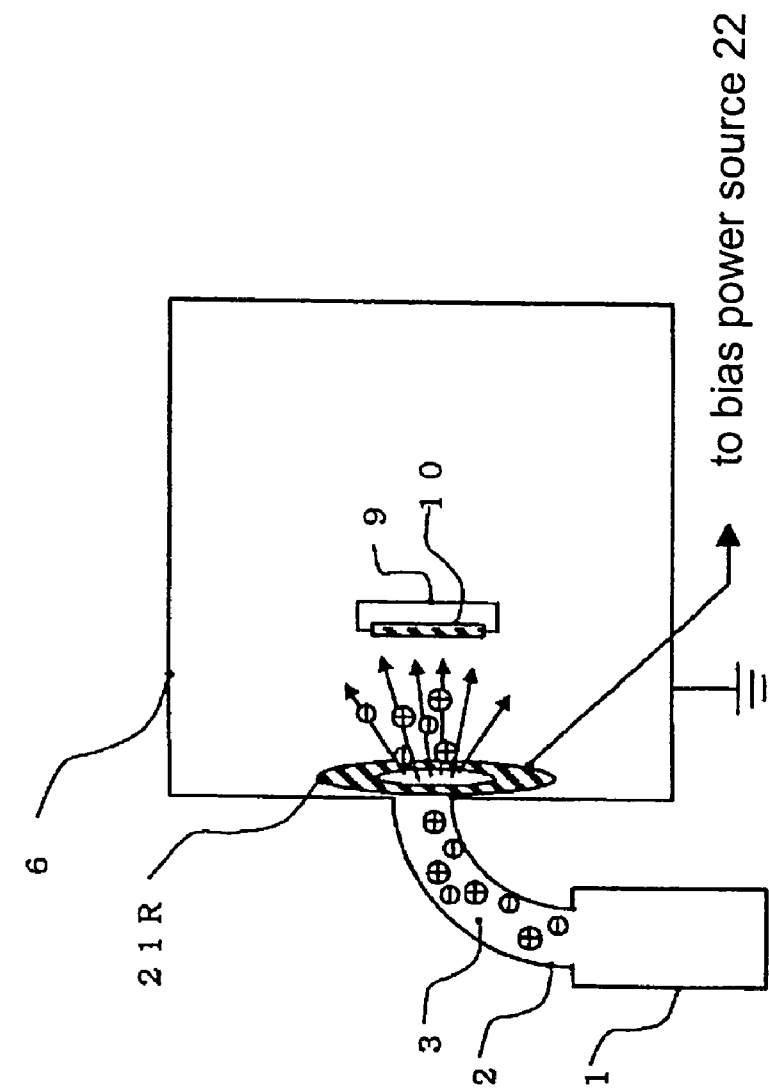
FIG. 6 is a block diagram showing a film deposition device according to a further embodiment of the invention.
Figure 7:
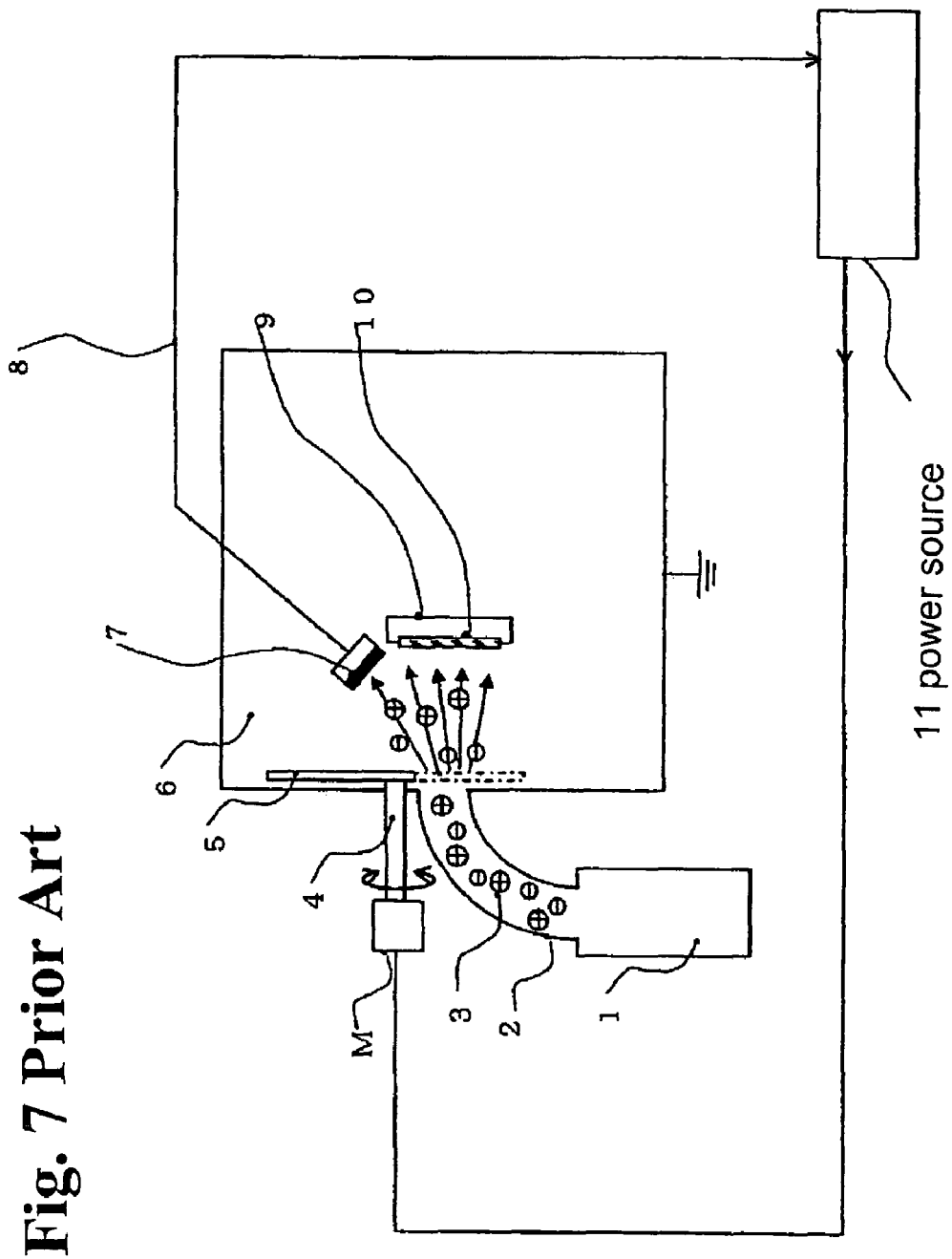
FIG. 7 is a block diagram showing a conventional film deposition device.
Figure 8:
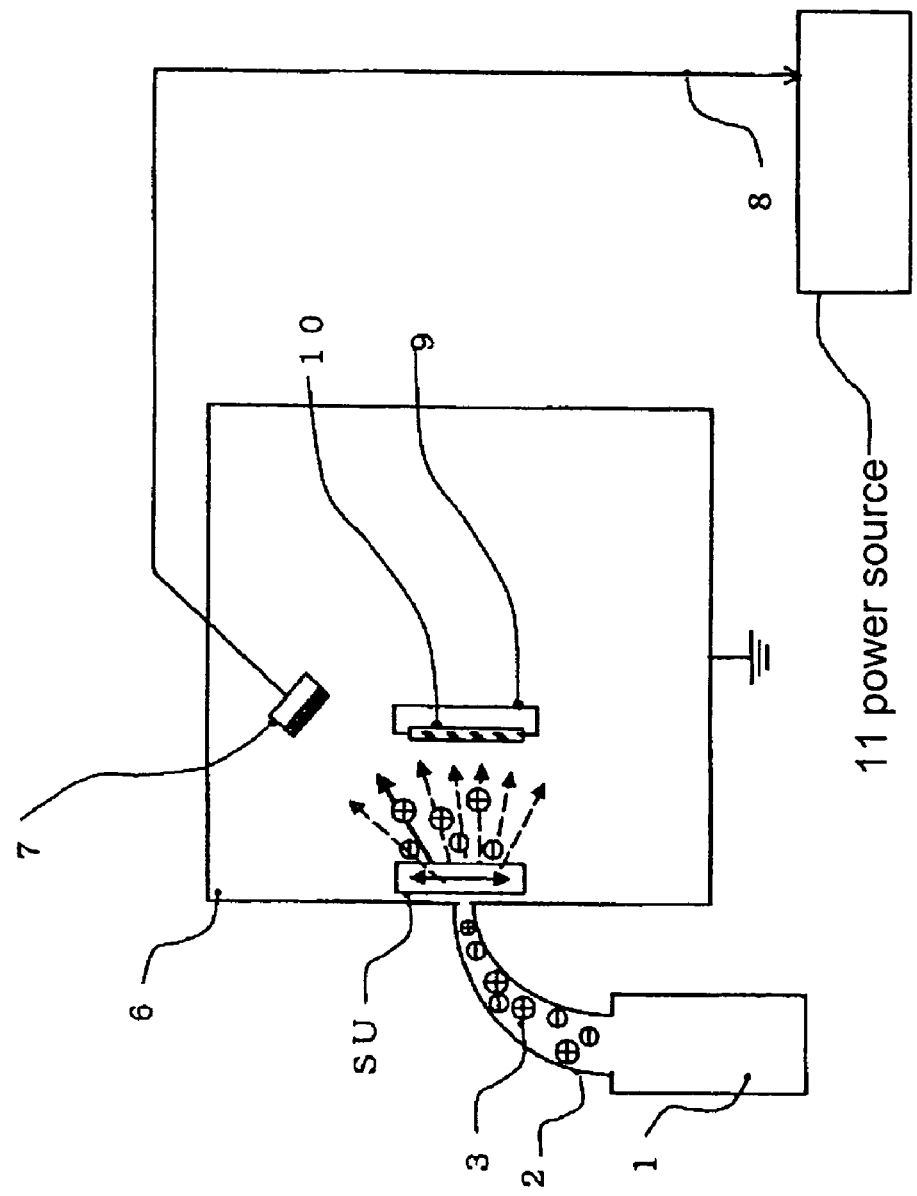
FIG. 8 is a block diagram showing a conventional scanning type film deposition device.

As shown in FIG. 5(c), the outer circular cylinder 21S may be replaced with a square outer basket member 21T; and the inner circular cylinder 21U may be replaced with a circular ring 21R. As shown in FIG. 5(d), the outer circular cylinder 21S may be replaced with the depositing chamber 6, and the inner circular cylinder 21U may be replaced with the circular ring 21R. A modified example using the structure as shown in FIG. 5(d) is shown in FIG. 6. Further, instead of the circular ring 21R, a plurality of conductive plates electrically connected to each other and having two dimensional surfaces crossing the plasma may be provided as a monitoring device at an intermediate position between the incident port of the plasma entering the depositing chamber and the substrate 10, and at a position where the plasma flow 3 does not enter the substrate 10. The present invention includes all these modifications.

The disclosure of Japanese Patent Application No. 2004-083046 filed on Mar. 22, 2004, is incorporated in the application.

While the invention has been explained with reference to the specific embodiments of the invention, the explanation is illustrative and the invention is limited only by the appended claims.

What is claimed is:

1. A film deposition device for depositing a film, comprising:
    a depositing chamber for depositing the film with plasma,
    a plasma quantity monitoring device disposed in the depositing chamber for monitoring a plasma quantity entering the depositing chamber at real time, and
    a calculating device electrically connected to the plasma quantity monitoring device configured to calculate a thickness of the film from the plasma quantity so that the thickness is monitored at real time,
    wherein said plasma quantity monitoring device includes a measuring device for measuring a quantity of electrons in the plasma and which comprises a Faraday cup that is disposed in the depositing chamber and so configured and arranged as to respond to electrons in the plasma and output a signal indicative thereof, the Faraday cup comprising an inner cylinder and a grounded outer cylinder, the inner cylinder being connected to a bias power source so as to be provided with a positive voltage from the bias power source.

2. A film deposition device according to claim 1, further comprising an output device for outputting a deposition completion signal when the thickness of the film reaches a predetermined level.

3. A film deposition device according to claim 1, wherein said plasma quantity monitoring device includes a plurality of monitoring devices.

4. A film deposition device according to claim 1, wherein said plasma quantity monitoring device includes a plurality of monitoring devices electrically connected to the calculating device to be used at a same time.

5. A film deposition device according to claim 1, wherein said plasma quantity monitoring device includes a circular cylinder surrounding an incident port of the plasma entering the depositing chamber at an intermediate position between the incident port and a substrate on which the plasma is deposited.

6. A film deposition device according to claim 1, wherein the measuring device is disposed adjacent a work piece so as to be constantly exposed to the plasma entering the depositing chamber.

7. A film deposition device according to claim 1, wherein the outer cylinder is connected to ground.

8. A film deposition device according to claim 1, wherein the measuring device comprises a plurality of Faraday cups which both comprise inner and outer members, the inner members being connected with a common source of positive voltage and the outer members being connected to ground.

9. A film deposition device according to claim 8, wherein the source of positive voltage comprises a bias power source and wherein the calculating device comprises:
    an ammeter which is connected with the bias power source;
    an amplifier which is connected in parallel with a capacitor which integrates the current passing through the ammeter.

10. A film deposition device according to claim 1, wherein an integration value of an output signal from the measuring device corresponds exactly to the thickness of the deposition.

11. A film deposition device according to claim 1, wherein said calculating device includes means for obtaining calibration data for obtaining a relationship between a calculated value of a Faraday cup current and a real deposit thickness.

12. A film deposition apparatus for depositing a film, comprising:
    a depositing chamber for depositing the film with plasma,
    a plasma quantity monitoring device disposed in the depositing chamber for monitoring a plasma quantity entering the depositing chamber at real time, and
    a calculating device electrically connected to the plasma quantity monitoring device configured to calculate a thickness of the film from the plasma quantity so that the thickness is monitored at real time, wherein said plasma quantity monitoring device comprises a ring at an intermediate position between an incident port to the plasma entering the depositing chamber and a substrate on which the plasma is deposited, said ring crossing the plasma entering from the incident port,
    wherein the ring is arranged so that all of the plasma entering the depositing chamber passes through the ring, wherein the ring is connected with a positive voltage of a bias power source and wherein the depositing chamber is connected to ground.

13. A film deposition device according to claim 12, wherein the ring disposed immediately adjacent a port in the depositing chamber through the plasma is introduced in the depositing chamber and spaced from a work piece on which material is being accumulated.

* * * * *